United States Patent
Umezawa et al.

(10) Patent No.: US 7,466,610 B2
(45) Date of Patent: Dec. 16, 2008

(54) NON-VOLATILE SEMICONDUCTOR MEMORY DEVICE

(75) Inventors: Akira Umezawa, Shinagawa-ku (JP); Jin Kashiwagi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/690,420

(22) Filed: Mar. 23, 2007

(65) Prior Publication Data
US 2007/0230246 A1 Oct. 4, 2007

(30) Foreign Application Priority Data
Mar. 24, 2006 (JP) ............... 2006-082605

(51) Int. Cl.
*G11C 11/00* (2006.01)
(52) U.S. Cl. ...................... 365/200; 365/226
(58) Field of Classification Search ........... 365/200, 365/226
See application file for complete search history.

(56) References Cited

U.S. PATENT DOCUMENTS 6,219,285 B1 * 4/2001 Murakuki et al. ........... 365/200
6,856,543 B2 2/2005 Atsumi et al.
2006/0233014 A1 * 10/2006 Oh ............................. 365/154
2007/0038805 A1 * 2/2007 Eliason et al. .............. 711/107

FOREIGN PATENT DOCUMENTS

JP 10-302476 11/1998

* cited by examiner

*Primary Examiner*—Michael T Tran
(74) *Attorney, Agent, or Firm*—Oblon, Spivak, McClelland, Maier & Neustadt, P.C.

(57) ABSTRACT

A non-volatile semiconductor memory device comprises a redundant memory cell to store address data of a defect cell in a memory cell array. A first decoder circuit is given a first drive voltage to provide a control signal to the redundant memory cell. A dummy memory cell has a threshold voltage corresponding to the redundant memory cell. A second decoder circuit is given a second drive voltage corresponding to the first drive voltage to provide a control signal to the dummy memory cell. A comparator circuit compares data to be read out of the dummy memory cell with data actually read out of the dummy memory cell.

12 Claims, 11 Drawing Sheets

NON-VOLATILE SEMICONDUCTOR MEMORY DEVICE

CROSS REFERENCE TO RELATED APPLICATION

This application is based on and claims the benefit of priority from prior Japanese Patent Application No. 2006-82605, filed on Mar. 24, 2006, the entire contents of which are incorporated herein by reference.

BACKGROUND OF THE INVENTION

1. Field of the Invention

The present invention relates to a non-volatile semiconductor memory device.

2. Description of the Related Art

In a large-scale semiconductor memory, a redundancy circuit for failure relieving is provided. It is similarly provided in an electrically erasable programmable flash EEPROM capable of storing data in a non-volatile state. When a defect cell is found through a wafer test, the defect address associated therewith is stored in a redundant memory cell. The redundant memory cell is composed of a non-volatile memory to prevent stored data from being lost even after power-off. In the flash EEPROM the redundant memory cell comprises a memory cell array similar to the normal memory cell array to reduce the cost.

Once the defect address is stored in the redundant memory cell, the defect address data is taken in a data latch circuit for defect address, on initial setting executed after power-on and before the supply voltage reaches a desired voltage that enables normal read/write operation. Then, the data in the data latch circuit is compared with address data fed into an I/O buffer. If a match is detected, a redundancy replacement control is executed in which a decoder circuit is controlled to select a redundant cell instead of the defect cell (see JP 10-302476A, FIGS. 11 and 12, paragraphs 0119-0172, for example).

As described above, in the flash EEPROM the redundant memory cell may be configured as a memory cell array similar to the normal memory cell array. In this case, reading from the redundant memory cell requires the application of a voltage similar to that when a normal memory cell is subject to reading. Specifically, a middle voltage having an almost middle value between a threshold voltage of a memory cell storing "1" data and a threshold voltage of a memory cell storing "0" data must be applied to a word line to read out the defect address data. A variation in production of voltage generators for generating such the middle voltage may occasionally prevent such the middle voltage from being generated accurately. In such the case, the defect address data is read erroneously and the redundancy replacement control can not be executed accurately as a problem.

SUMMARY OF THE INVENTION

In one aspect the present invention provides a non-volatile semiconductor memory device, comprising: a memory cell array including electrically rewritable non-volatile memory cells arrayed: a redundant memory cell having threshold voltages differing in accordance with data to be stored and operative to store address data of a defect cell in the memory cell array; a first decoder circuit given a first drive voltage to provide a control signal to the redundant memory cell; a latch circuit storing the address data of the defect cell read out of the redundant memory cell; a dummy memory cell having a threshold voltage corresponding to the redundant memory cell; a second decoder circuit given a second drive voltage corresponding to the first drive voltage to provide a control signal to the dummy memory cell; and a comparator circuit operative to compare data to be read out of the dummy memory cell with data actually read out of the dummy memory cell and, based on a result of the comparison, permit the redundancy replacement control to be started.

BRIEF DESCRIPTION OF THE DRAWINGS

FIG. 14 illustrates a cross-sectional structure of a redundancy memory cell in a redundancy memory cell array 1a.

DETAILED DESCRIPTION OF THE EMBODIMENTS

The embodiments of the present invention will now be described below with reference to the drawings.

First Embodiment

Figure 1:
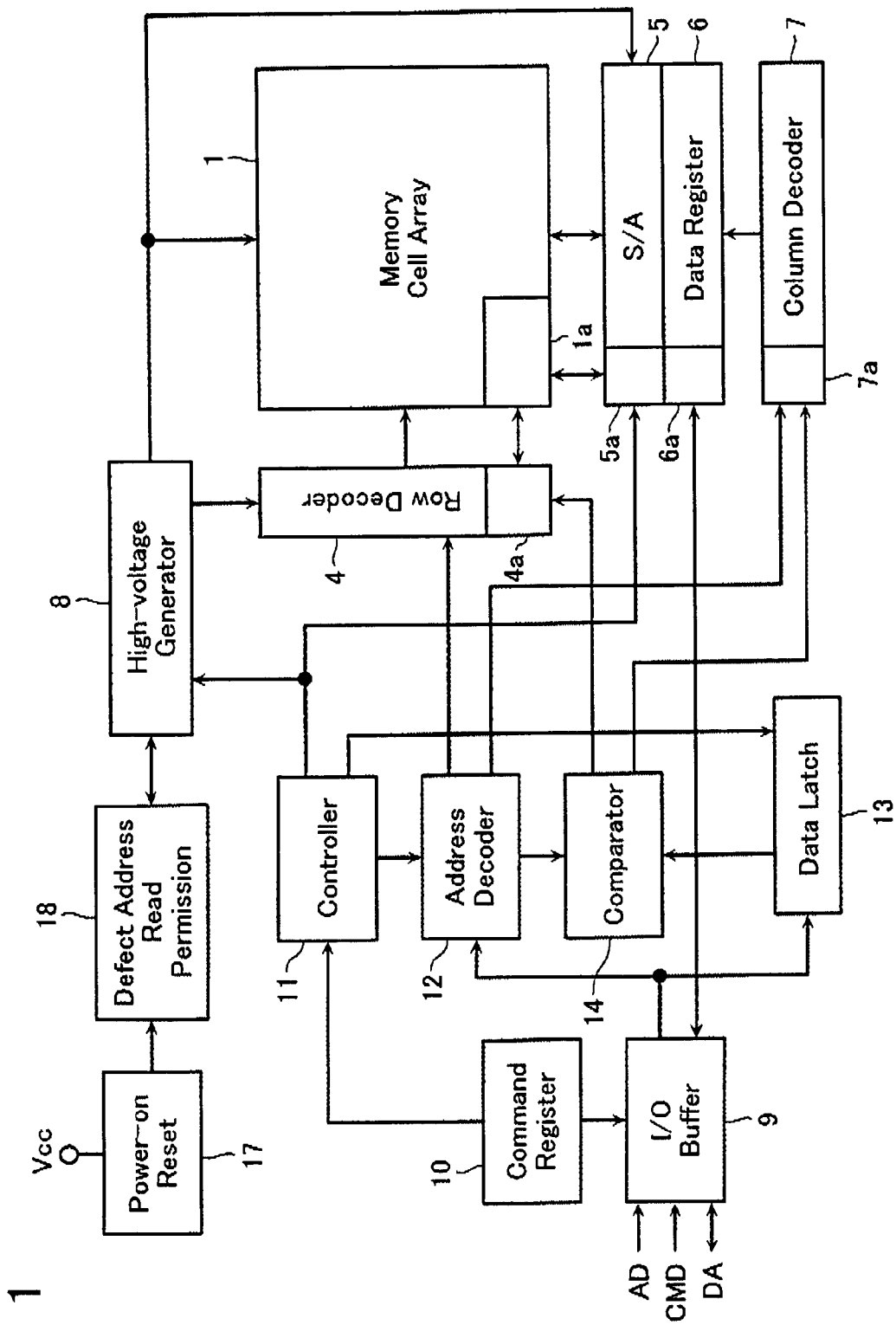
FIG. 1 is a block diagram showing an arrangement of a non-volatile semiconductor memory device according to a first embodiment of the present invention.

FIG. 1 shows an arrangement of a non-volatile semiconductor memory device according to a first embodiment of the present invention.

This non-volatile semiconductor memory device is a flash EEPROM, which comprises a memory cell array 1 including electrically erasable programmable non-volatile memory cells arrayed in a matrix. A non-volatile memory cell has a MOS transistor structure of the stacked gate type that includes a floating gate and a control gate stacked.

The memory cell array 1 includes a redundant memory cell array 1a provided to store address data of a defect cell existing in the memory cell array 1. Although this embodiment describes that the redundant memory cell array 1a is formed as part of the normal memory cell array 1, the present invention is not limited to this example. For example, the redundant memory cell array 1a may be configured separately from the normal memory cell array 1. A memory cell in the redundant memory cell array 1a stores data using threshold voltages differing in accordance with data to be stored, like a memory cell in the normal memory cell array 1.

Figure 2:
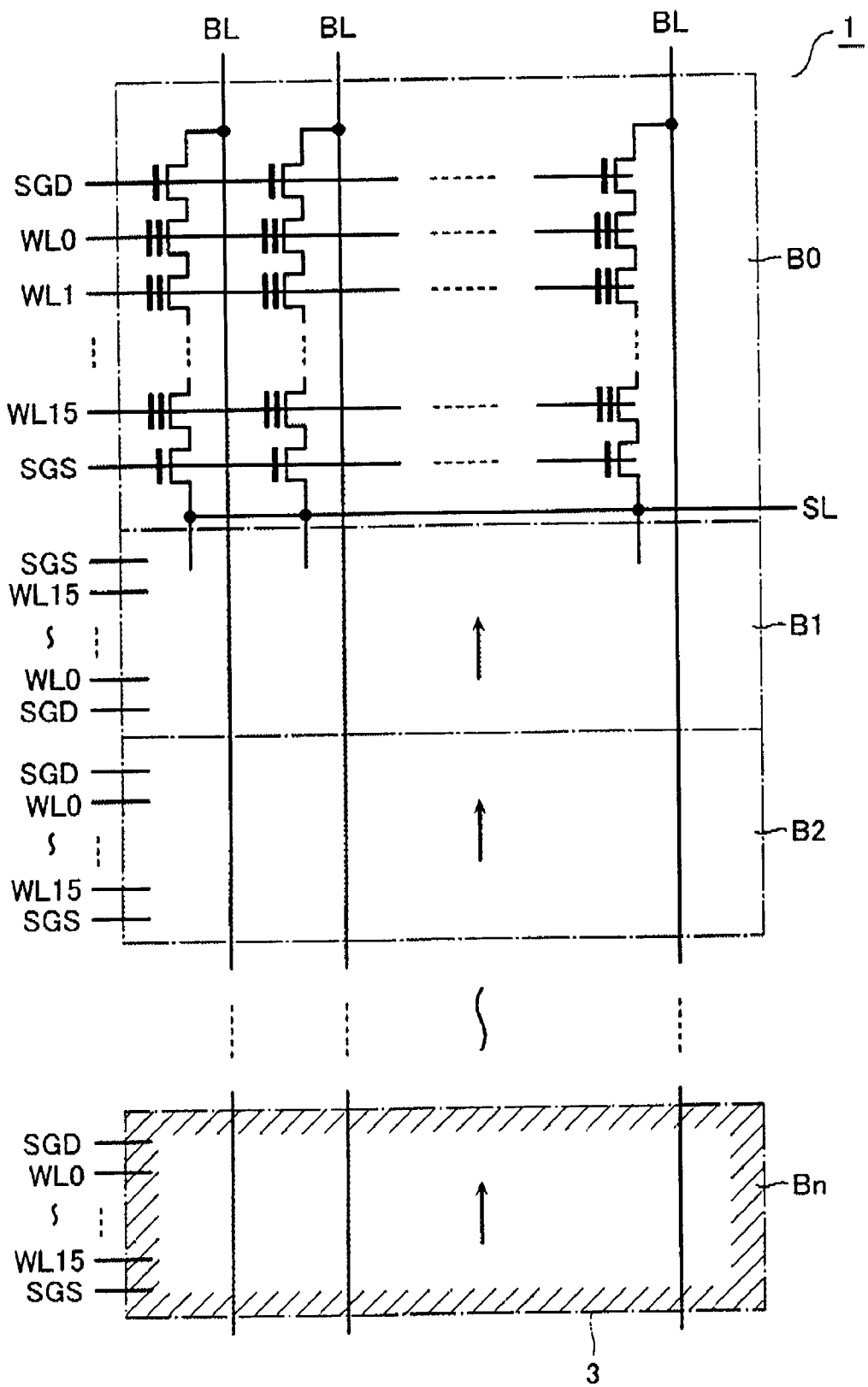
FIG. 2 shows a specific arrangement example of a memory cell array 1 shown in FIG. 1.

FIG. 2 shows a specific arrangement example of the memory cell array 1. This example shows an arrangement of an NAND-type flash EEPROM including NAND cell units each composed of 16 memory cells serially connected. The present invention is not limited to this NAND-type but also applicable to various types such as the NOR-type, the AND-type, and the DINOR-type.

In FIG. 2, a plurality of NAND cell units with word lines WL commonly disposed configure a cell block that is handled as the minimum unit of data erase. A plurality of cell blocks B0, B1, ..., Bn are arranged with bit lines BL commonly used. In this example, one NAND cell unit includes 16 NAND cells serially connected and selection transistors connected to both ends thereof.

The bit lines BL in the memory cell array 1 are connected via a sense amp circuit 5 to a data register 6. To select a bit line BL and a word line WL in the memory cell array 1, a column decoder 7 and a row decoder 4 are provided. An address AD, data DA and a command CMD are fed into an I/O buffer 9. The address is taken into an address register 12, the command into a command register 10, and the write data into a data register 6.

A row address and a column address generated from the address register 12 are decoded at the row decoder 4 and the column decoder 7, respectively, to select a memory cell. A variety of voltages for use in data write and erase are generated from a high-voltage generator circuit 8 (booster circuit) comprising a booster circuit and so forth. The command taken into the command register 10 may be decoded at the controller circuit 11. The controller circuit 11 sequentially controls data write and erase.

On data write, a verify operation is executed to confirm the write operation and written condition in a selected memory cell and control is executed to write data again in the memory cell insufficiently written. On data erase, a verify operation is executed similarly to confirm the erase operation and erased condition in a selected block and, if insufficiently erased, control is executed to erase it again. When a write mode or an erase mode is set, the controller circuit 11 controls a series of write or erase operations described above.

In addition to the row decoder 4, the sense amp 5, the data register 6 and the column decoder 7, a row decoder 4a, a sense amp 5a, a data register 6a and a column decoder 7a are provided to address the redundant memory cell array 1a, sense and write/read data.

The row decoder 4a and the column decoder 7a are provided to select a bit line and a word line in the redundant memory cell array 1a to read out defect address data at a stage after power-on and before starting the normal read/write operation. The sense amp 5a is provided to sense data read out through the selection of the bit line and the word line. The data register 6a is provided to temporarily store the sensed data. The row decoder 4a, the column decoder 7a and the sense amp 5a operate like the row decoder 4, the column decoder 7 and the sense amp 5 when the boosted voltage is applied thereto from the high-voltage generator circuit 8.

In this flash EEPROM, the high-voltage generator circuit 8 and so forth start operating when they receive a power-on reset signal PONRST output from a power-on reset circuit 17 after power-on. When the defect address data written in the redundant memory cell array 1a is read out, a redundancy replacement control is executed. The defect address data read out is stored via the I/O buffer 9 into the data latch circuit 13. After the defect address data is stored in the data latch circuit 13, the comparator circuit 14 executes the redundancy replacement control. When the data latch circuit 13 confirms a match between the address data sent from the I/O buffer 9 and stored in the address buffer 12 and the defect address data stored in the data latch circuit 13, a redundancy replacement control is executed to replace a defect cell having the defect address by a redundant cell.

An accurate execution of the redundancy replacement control requires accurate reading of the defect address data written in the redundant memory cell array 1a. At the time of the beginning of reading out the defect address data, however, the boosted voltage from the high-voltage generator circuit 8 may not reach a desired voltage. In such the case, the defect address data may be read out erroneously. In the present embodiment, a defect address read permission circuit 18 is provided to avoid an occurrence of such the situation and make it possible to read out the defect address data not erroneously but accurately.

Figure 3:
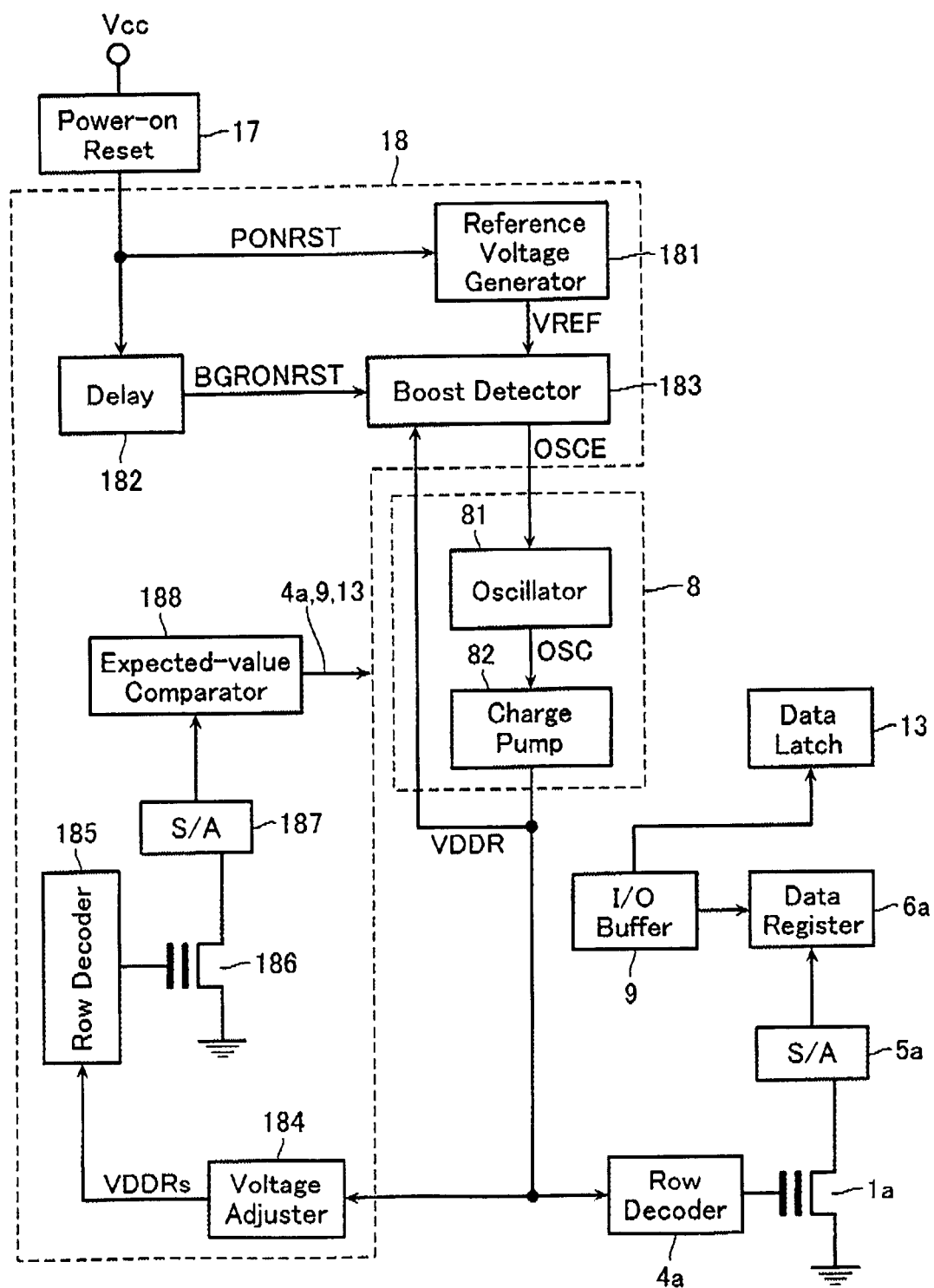
FIG. 3 is a block diagram illustrative of an arrangement of a defect address read permission circuit 18 shown in FIG. 1.

FIG. 3 shows an arrangement of the defect address read permission circuit 18 in a block diagram. The defect address read permission circuit 18 includes a reference voltage generator circuit 181, a delay circuit 182, and a boost detector circuit 183. The reference voltage generator 181 is a circuit operative to generate a certain reference voltage VREF based on an external supply voltage Vcc and may be composed of the so-called bandgap reference circuit.

The reference voltage generator circuit 181 is configured to start operating on receipt of the power-on reset signal PONRST output from the power-on reset circuit 17. The delay circuit 182 is operative to provide a delayed signal BGRONRST when a certain delay time elapsed after receipt of the power-on reset signal PONRST. The delay circuit 182 sets as the delay time a sufficient time for stabilizing the reference voltage VREF output from the reference voltage generator 181.

The boost detector circuit 183 switches a boost initiation/termination signal OSCE from "L" to "H" on receipt of the delayed signal BGRONRST and gives an instruction for starting voltage boosting to the high-voltage generator circuit 8. The high-voltage generator circuit 8 comprises an oscillator 81 and a charge pump circuit 82. The oscillator 81 starts oscillation in response to the transition of the boost initiation/termination signal OSCE from "L" to "H" and the charge pump circuit 82 correspondingly starts voltage boosting.

A voltage VDDRN generated by a splitting resistance from a boosted voltage VDDR output from the charge pump circuit 82 is compared with the reference voltage VREF at the boost detector circuit 183. If the former is determined larger than the latter as a result of the comparison, the boost initiation/termination signal OSCE is switched from "H" to "L", and an instruction for terminating voltage boosting is given to the high-voltage generator circuit 8. In this case, the oscillator 81 halts oscillation and the charge pump circuit 82 correspondingly halts voltage boosting.

Once voltage boosting is halted, the row decoder 4a employs the boosted voltage VDDR at the time of halting as the drive voltage to generate a word line voltage for reading out the defect address data written in the redundant memory cell array 1a. The read data is then amplified through the sense amp 5a and provided via the data register 6a to the I/O buffer 9.

If the defect address read permission circuit 18 determines that the boosted voltage VDDR is not boosted sufficiently and the possibility of erroneous read is left, it provides a read inhibit signal to the I/O buffer 9 to prevent the read data from being latched in the data latch circuit 13. If the data with the possibility of erroneous read has been already latched in the data latch circuit 13, the data is forcibly erased. This operation is executed in the defect address read permission circuit 18, which includes a voltage adjuster circuit 184, a row decoder 185, a dummy memory cell 186, a sense amp 187 and an expected-value comparator circuit 188.

The voltage adjuster 184 is a circuit configured to increase or decrease the level of the boosted voltage VDDR and herein operative to generate a drive voltage VDDRs slightly lower (for example, around 10-20% smaller) than the boosted voltage VDDR. This makes it possible to insure a voltage margin of the word line voltage relative to the "1" data memory cell and accurately read out the defect address data without erroneous read.

The row decoder 185 employs the drive voltage VDDRs as the drive voltage to generate a word line voltage for reading out the expected-value data written in the dummy memory cell 186. In this case, the dummy memory cell 186 has the same threshold voltage as that of the memory cell used to store "1" data in the redundant memory cell array 1a, and the expected-value data is assumed equal to "1". The threshold voltage of the dummy memory cell 186 is not always required to be same as the threshold voltage of the memory cell in the redundant memory cell array 1a but rather sufficient if it has a certain corresponding relation therewith.

The sense amp 187 is provided to amplify the signal read out of the dummy memory cell 186. The expected-value comparator circuit 188 has a function of comparing the expected-value data stored in the dummy memory cell 186 with the data actually read out of the dummy memory cell 186. It determines whether reading data out of the dummy memory cell 186 is completed accurately (that is, if "1" data is stored as described above, "1" can be read out as it is).

If both of data are determined identical, the expected-value comparator circuit 188 provides a read permission signal to the row decoder 4a, the I/O buffer 9 and the data latch 13. In this case, on the basis of the defect address data read out of the redundancy memory cell array 1a and stored in the data latch 13, a redundancy replacement control is started.

In contrast, if both of data are determined not identical (not coincident), the expected-value comparator circuit 188 provides a read inhibit signal to the row decoder 4a, the I/O buffer 9 and the data latch 13. In this case, reading defect address data out of the redundancy memory cell array 1a is tried again from the beginning and the data already stored in the data latch 13 is forcibly erased. This is because the boosted voltage VDDR applied to the row decoder 4a may not reach a desired voltage if both of data are not identical. In such the case, it is highly possible that defect address data has been erroneously read out of the redundancy memory cell array 1a and, therefore, the redundancy replacement control can not be appropriately executed.

Figure 4:
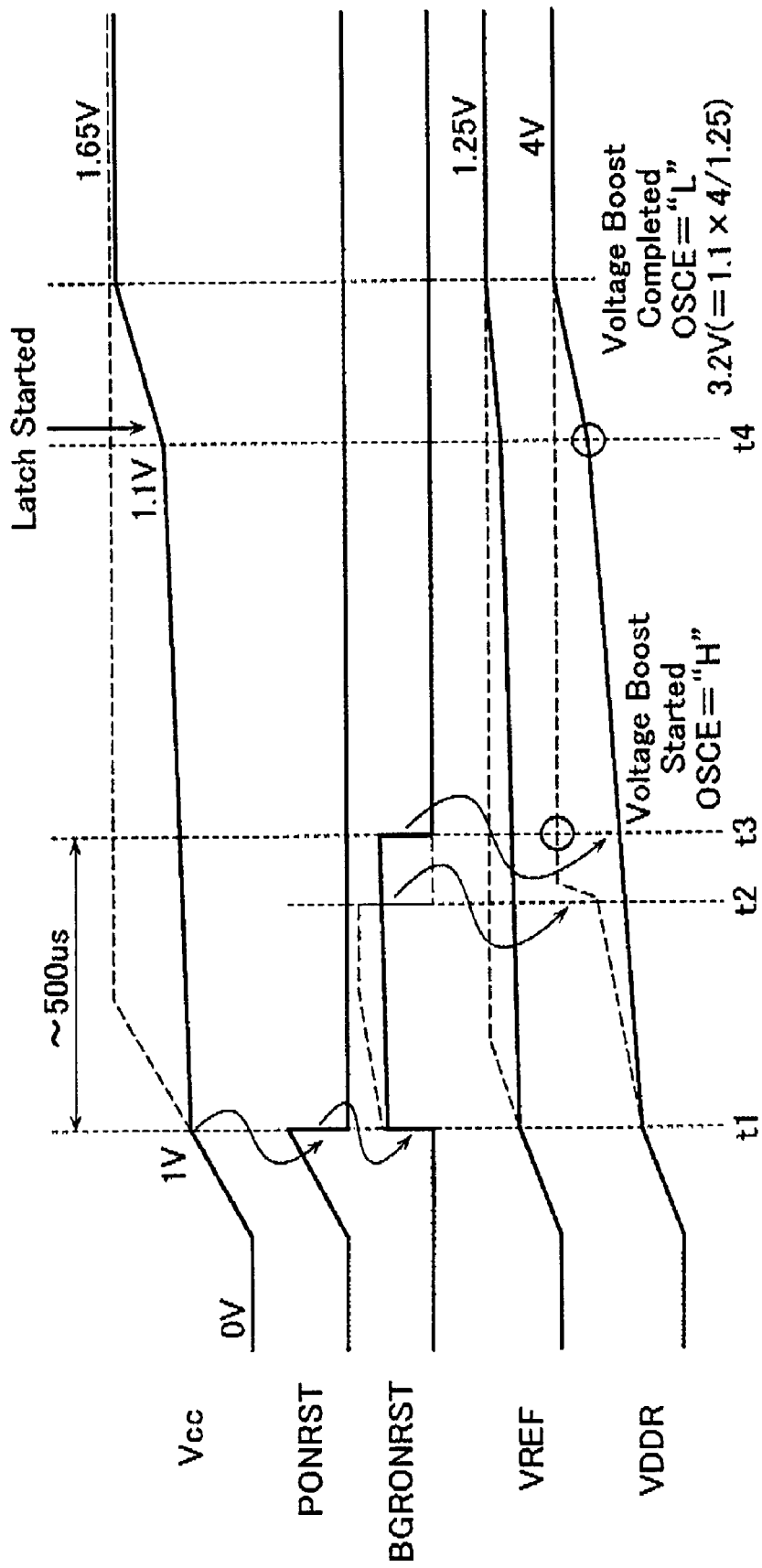
FIG. 4 is a waveform diagram showing operations of various parts in the circuit of FIG. 3.

This point is described in detail with reference to FIG. 4. In FIG. 4 the dashed lines indicate variations in voltage on various parts when a general power supply works in normal operation while the solid lines indicate variations in voltage on various parts on abnormal operation (partly overlapped).

When the external supply voltage Vcc gradually rises from 0 V and reaches 1 V, for example, the power-on reset circuit 17 lowers the power-on reset signal PONRST from "H" to "L". Thereafter, on normal operation, Vcc reaches a steady-state value, for example, 1.65 V within 500 μs. To the contrary, on abnormal operation, this rising curve is made slower and may rise to around 1.1 V at most even after a considerable time elapses as shown in FIG. 4, for example.

In this case, the reference voltage VREF output from the reference voltage generator circuit 181 also can not stabilize at a steady-state value, for example, 1.25 V within 500 μs and rests at a much lower value. At this time, the delay circuit 182 switches the delayed signal BGRONRET from "H" to "L" at time t3 slightly later than the time of normal operation (time t2). On receipt of this transition, the boost detector circuit 183 switches the boost initiation/termination signal OSCE from "L" to "H" to give an instruction for beginning voltage boosting to the high-voltage generator circuit 8. At this moment, however, the external supply voltage Vcc has not risen sufficiently, and the reference voltage VREF and the boosted voltage VDDR remain at greatly lower values than the steady-state values. At this time, the boost detector circuit 183 compares the reference voltage VREF with the resistively divided value VDDRN of the boosted voltage VDDR. Therefore, it detects completion of voltage boosting, for example, at around 3.2 V before the boosted voltage VDDR reaches a desired voltage (such as 4 V).

In this state, when the row decoder 4a starts operation, reading of the redundancy memory cell array 1a is started, and the data latch 13 latches the data, erroneous redundancy replacement control may be possibly executed on the basis of the defect address data that has been erroneously read out. In the present embodiment, however, on such abnormal operation, the expected-value data can not be accurately read out of the dummy memory cell 186 in the defect address data read permission circuit 18 (that is, data different from data grasped as the expected-value data is read out of the dummy memory cell 186). Therefore, the expected-value comparator circuit 188 provides an inhibit signal to inhibit starting and continuing the redundancy replacement control. Accordingly, it is possible to prevent the redundancy replacement control from being executed on the basis of the defect address data erroneously read out.

The description of FIG. 4 is given to the procedure for permission/inhibitory in beginning the redundancy replacement control after power-on though the present invention is not limited to this case. For example, it is also applicable to the case where the boosted voltage VDDR once rises sufficiently and reading out defect address data is started normally, and then VDDR varies again and disables the defect address data to read out normally, needless to say.

Figure 5:
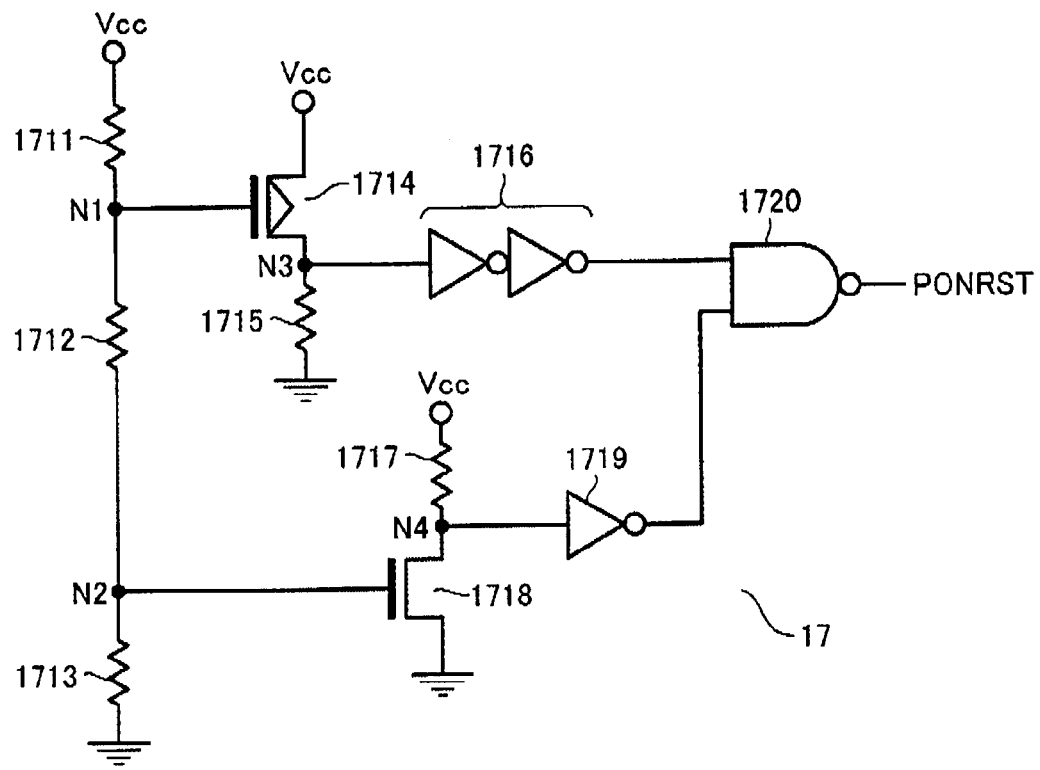
FIG. 5 is a circuit diagram showing an arrangement example of a power-on reset circuit 17 of FIG. 3.

FIG. 5 is a circuit diagram showing an arrangement example of the power-on reset circuit 17. The power-on reset circuit 17 includes resistors 1711, 1712, 1713 serially connected between the supply voltage Vcc and the ground voltage, and has a p-type MOS transistor 1714 and a resistor 1715 serially connected between the supply voltage Vcc and the ground voltage similarly. A node N1 between the resistors 1711 and 1712 is connected to the gate of the p-type MOS transistor 1714. A node N3 between the p-type MOS transistor 1714 and the resistor 1715 is connected to a two-stage inverter circuit 1716. Similarly, a resistor 1717 and an n-type MOS transistor 1718 are serially connected between the supply voltage Vcc and the ground voltage. The n-type MOS transistor 1718 has a gate, which is connected to a node N2 between the resistors 1712 and 1713. A node N4 between the resistor 1717 and the n-type MOS transistor 1718 is connected to a single-stage inverter circuit 1719. An NAND gate 1720 is provided to receive output signals from the inverter circuits 1716 and 1719.

In accordance with this arrangement, the p-type MOS transistor 1714 and the n-type MOS transistor 1718 turn on at different timings as Vcc rises. As a result, the NAND gate 1720 provides a power-on reset signal in the form of a pulse signal.

Figure 6:
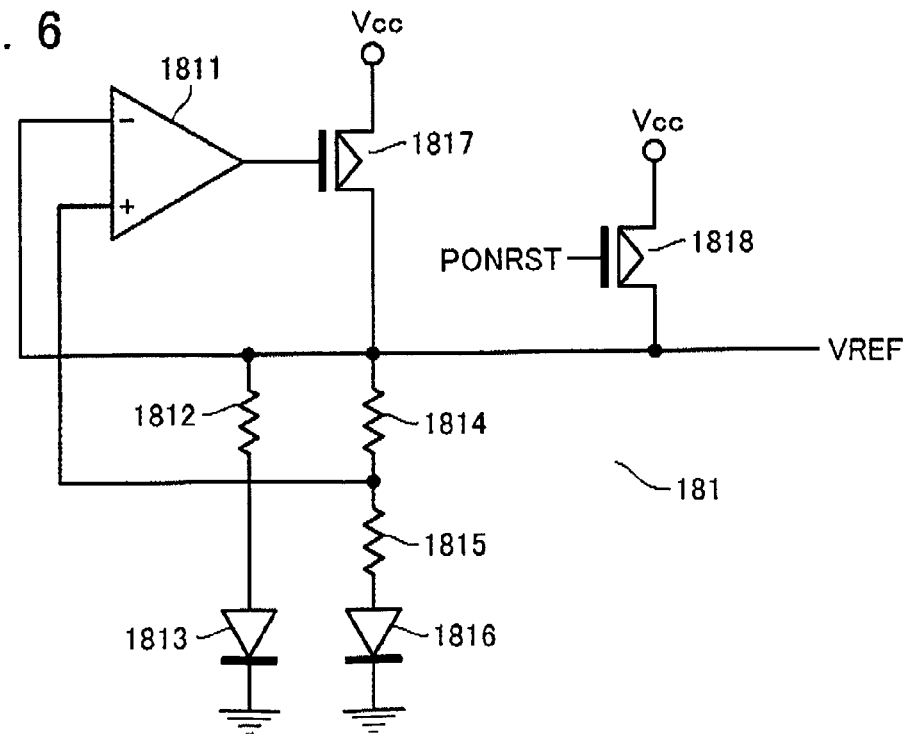
FIG. 6 is a circuit diagram showing an arrangement example of a reference voltage generator circuit 181 shown in FIG. 3.

FIG. 6 is a circuit diagram showing an arrangement example of the reference voltage generator circuit 181. The reference voltage generator circuit 181 includes an operational amplifier 1811. It also includes a first current path composed of a resistor 1812 and a diode 1813, and a second current path composed of resistors 1814, 1815 and a diode 1816, both between the output terminal of the reference voltage VREF and the ground voltage.

The diode 1816 consists of a plurality (N) of diodes connected in parallel while the diode 1813 consists of a single diode. The resistors 1812, 1814 are designed to have an equal resistance R2 while the resistor 1815 is designed to have a resistance R1. A ratio between the resistances R1 and R2 can be appropriately set to generate a reference voltage VREF having no temperature dependence.

The operational amplifier 1811 has an output terminal, which is connected to the gate of a P-type MOS transistor 1817. The P-type MOS transistor 1817 has a source, which is connected to the external supply voltage Vcc, and a drain, which serves as the output terminal of the reference voltage VREF. The operational amplifier 1811 has a non-inverting input terminal, which is connected to a node between the resistors 1814 and 1815, and an inverting input terminal, which is connected to the output terminal of the reference voltage VREF. The output terminal of the reference voltage VREF is connected to a PMOS transistor 1818, which is connected to the supply voltage Vcc and switched in response to the power-on reset signal PONRST.

Figure 7:
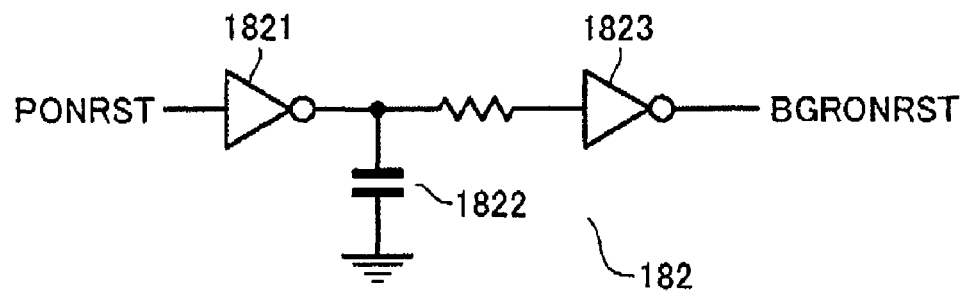
FIG. 7 is a circuit diagram showing an arrangement example of a delay circuit 182 shown in FIG. 3.

FIG. 7 is a circuit diagram showing an arrangement example of the delay circuit 182. The delay circuit 182 includes an inverter circuit 1821, a CR time constant circuit 1822, and an inverter circuit 1823. The inverter circuit 1821 has an input terminal to receive the power-on reset signal PONRST, which is turned into a signal with a delayed variation corresponding to the time constant of the CR time constant circuit 1822 and provided to external from the inverter circuit 1823.

Figure 8:
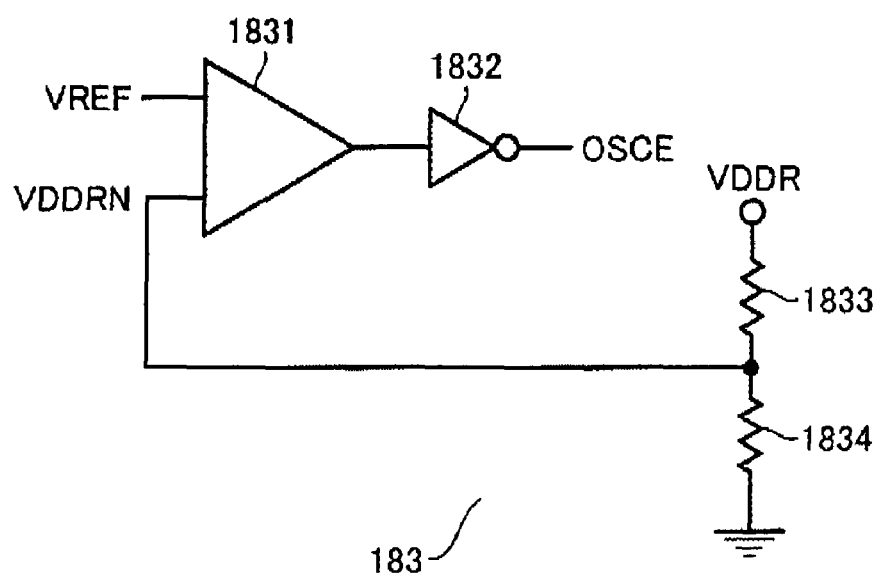
FIG. 8 is a circuit diagram showing an arrangement example of a boost detector circuit 183 shown in FIG. 3.

FIG. 8 is a circuit diagram showing an arrangement example of the boost detector circuit 183. The boost detector circuit 183 includes an operational amplifier 1831 and an inverter circuit 1832. It also includes a divider resistor composed of resistors 1833 and 1834. The divider resistor has one end supplied with the output voltage or the boosted voltage from the high-voltage generator circuit 8, and the other end grounded.

The operational amplifier 1831 serves as a comparator that compares the reference voltage FREF with the divided voltage VDDRN of the boosted voltage VDDR generated at the above-described divider resistor. A signal indicative of the result of the comparison is provided to external from the inverter circuit 1832 as the boost initiation/termination signal OSCE.

Figure 9:
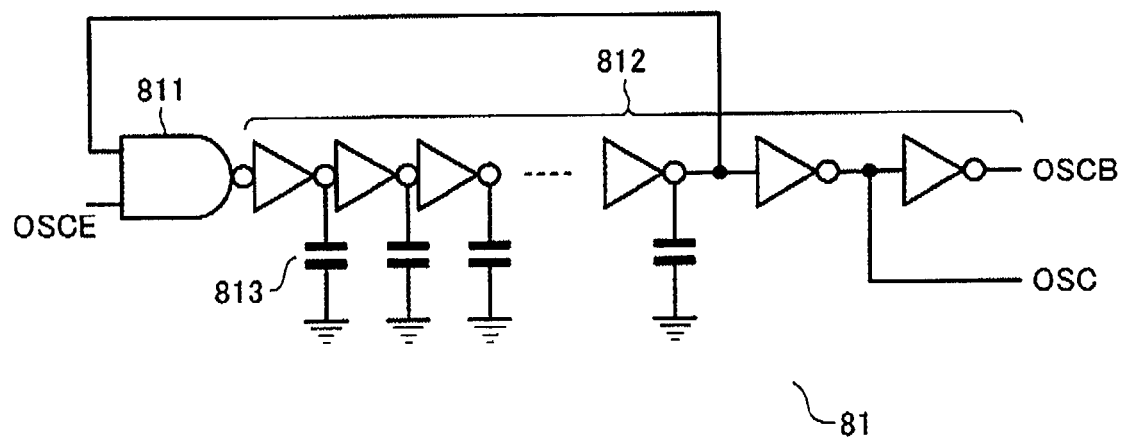
FIG. 9 is a circuit diagram showing an arrangement example of an oscillator 81 shown in FIG. 3.

FIG. 9 is a circuit diagram showing an arrangement example of the oscillator 81. The oscillator 81 includes an NAND gate 811, an inverter chain circuit 812 connected to the output terminal of the NAND gate 811, and a plurality of capacitors 813 connected between nodes in the inverter chain and the ground potential. The NAND gate 811 has one input terminal to receive the boost initiation/termination signal OSCE and the other to receive a signal fed back from one of inverter circuits contained in the inverter chain circuit 812. Thus, the NAND gate 811 and the inverter chain circuit 812 form a ring oscillator, which provides oscillation outputs OSC and OSCB. The oscillation outputs OSC and OSCB are logically inverted signals.

Figure 10:
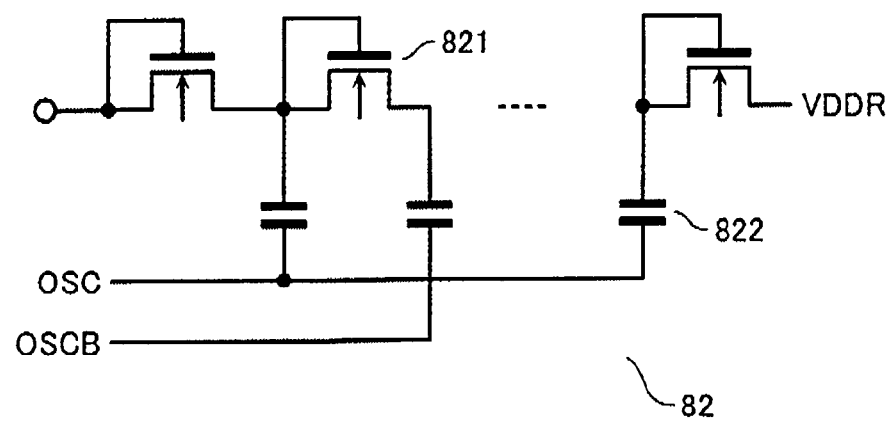
FIG. 10 is a circuit diagram showing an arrangement example of a charge pump circuit 82 shown in FIG. 3.

FIG. 10 is a circuit diagram showing an arrangement example of the charge pump circuit 82. The charge pump circuit 82 includes a train of serially connected, diode-connected MOS transistors 821, and a plurality of capacitors 822 connected to nodes in the train. The capacitors 822 connected to odd nodes are given the oscillation output OSC while the capacitors 822 connected to even nodes are given the oscillation output OSCB to boost the voltage on the input terminal at every oscillation period.

Second Embodiment

Figure 11:
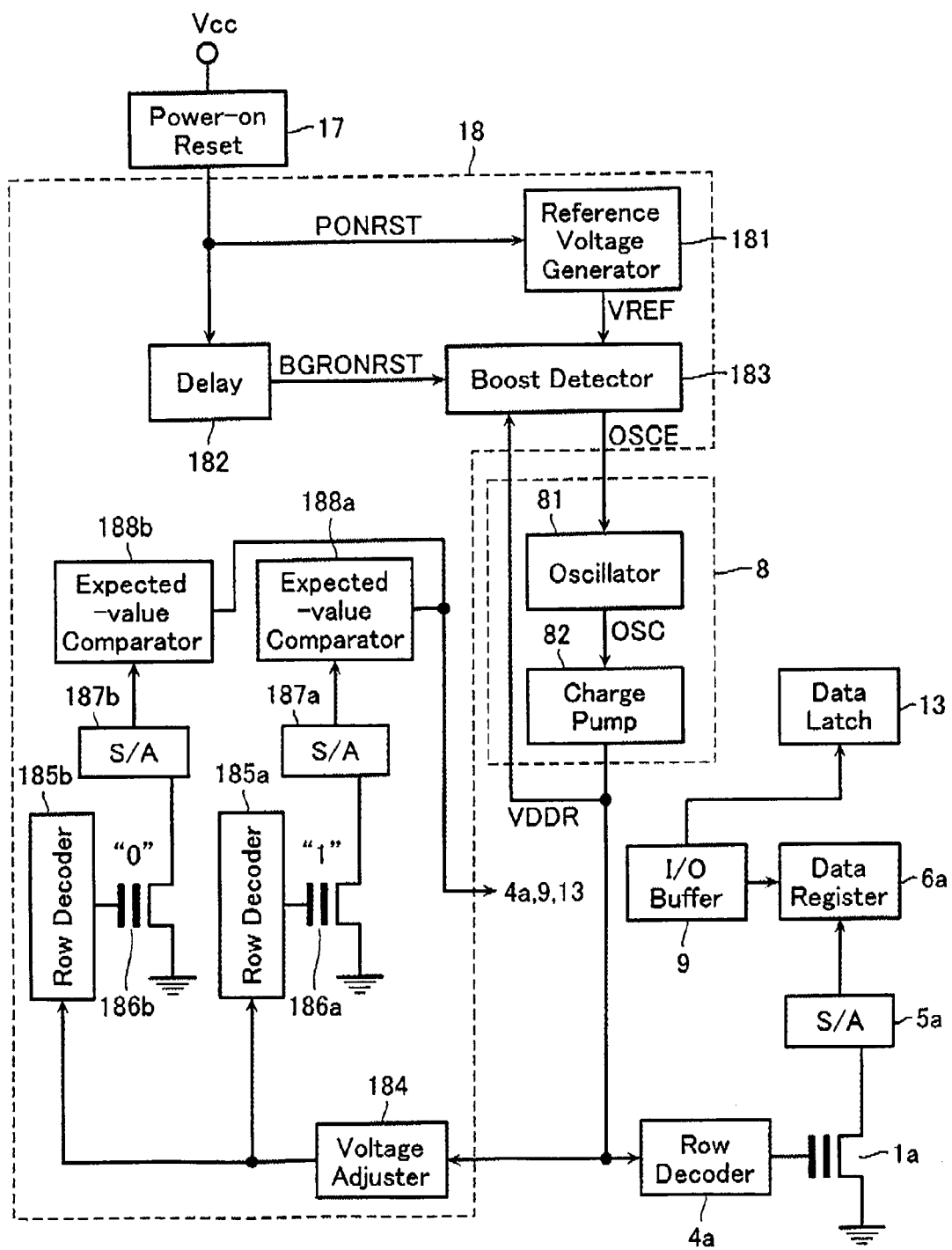
FIG. 11 is a block diagram showing an arrangement of a non-volatile semiconductor memory device according to a second embodiment of the present invention.

FIG. 11 is a block diagram showing an arrangement of the defect address read permission circuit 18 in a non-volatile semiconductor memory device according to a second embodiment of the present invention. The arrangement of the entire of the non-volatile semiconductor memory device is similar to that in the first embodiment as shown in FIG. 1 and accordingly omitted from the following detailed description. In FIG. 9 the same components as those in the first embodiment (FIG. 3) are denoted with the same reference numerals and omitted from the following detailed description.

The defect address read permission circuit 18 of this embodiment comprises two types of row decoders 185, dummy memory cells 186, sense amps 187 and expected-value comparators 188 (each set is denoted with subscripts a and b), different from the first embodiment.

The dummy memory cells 186*a* and 186*b* are given different threshold voltages, that is, expected data; the former is given "1" data, and the latter "0" data. In accordance with this arrangement, the dummy memory cell 186*a* achieves the same action as that in the first embodiment. In addition, the dummy memory cell 186*b* can prevent erroneous read of defect address data from arising as a result of the occurrence of an abnormal condition such as overshoot. The boosted voltage VDDR in such the case is erroneously identified as reaching a certain desired voltage level. Namely, if the abnormal condition such as overshoot arises, the boosted voltage may reach the threshold voltage of the "0" data memory cell or higher even temporarily. In such the case, in the first embodiment only including the dummy memory cell 186*a* given "1" data, the boosted voltage VDDR may be erroneously identified as if it reaches a desired voltage.

On the contrary, in the present embodiment, the dummy memory cell 186*b* is given "0" data. In this case, if an abnormal condition such as overshoot arises and the boosted voltage VDDR reaches the threshold voltage of the "0" data memory cell 186*b* or higher even temporarily, the data read out of the dummy memory cell 186*b* becomes not "0" but "1". Thus, the expected-value comparator circuit 188*b* provides the read inhibit signal. Therefore, this embodiment makes it possible to prevent erroneous identification due to an abnormal condition of voltage such as overshoot, and achieve more accurate read of defect address data and redundancy replacement control possibly.

Third Embodiment

Figure 12:
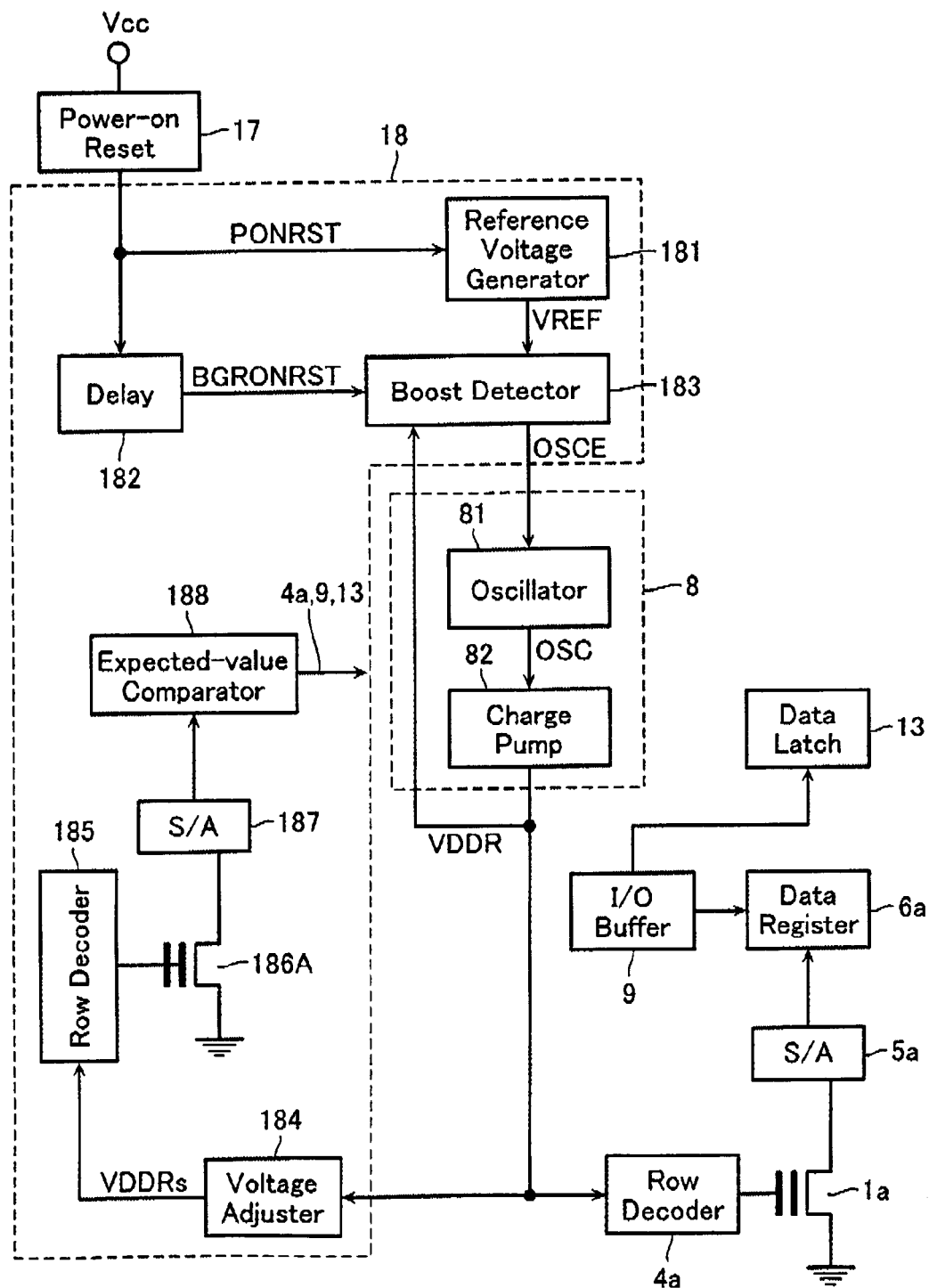
FIG. 12 is a block diagram showing an arrangement of a non-volatile semiconductor memory device according to a third embodiment of the present invention.

FIG. 12 is a block diagram showing an arrangement of the defect address read permission circuit 18 in a non-volatile semiconductor memory device according to a third embodiment of the present invention. The arrangement of the entire of the non-volatile semiconductor memory device is similar to the first embodiment and accordingly omitted from the following detailed description. In FIG. 12 the same components as those in the first embodiment are denoted with the same reference numerals and omitted from the following detailed description.

Figure 13:
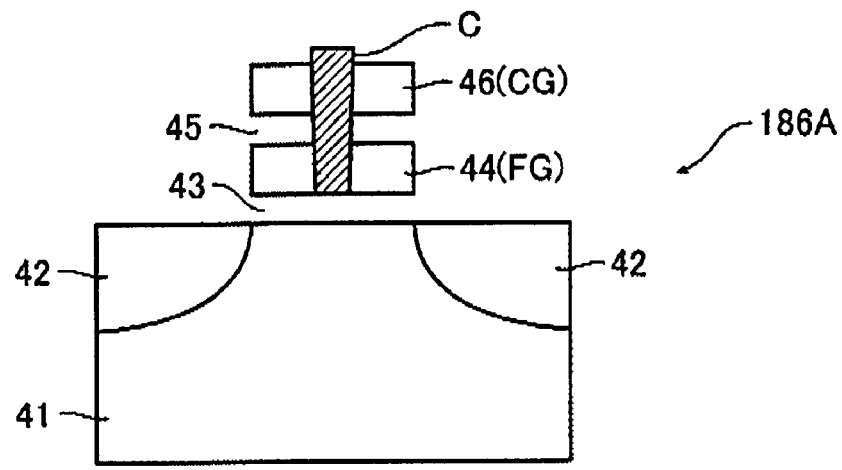
FIG. 13 illustrates a cross-sectional structure of a dummy cell 186A of the third embodiment.
Figure 14:
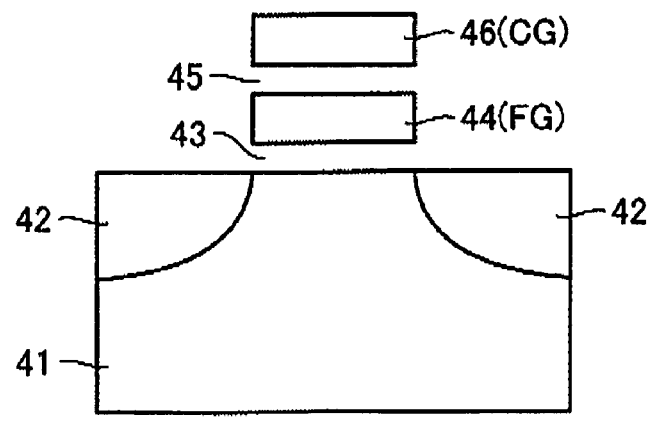

As shown in FIG. 13, this defect address read permission circuit 18 comprises a dummy memory cell 186A having a stacked-gate structure, in which a contact C with a word line extends through a control gate 46 to a floating gate 44, different from the first embodiment. Namely, the dummy memory cell 186A is configured as follows. N-type diffusion layers 42 serving as a source and drain of a MOSFET are formed on a substrate 41. A floating gate (FG) 44 is formed on this substrate 41 via a gate insulation layer 43. On this floating gate 44, a control gate (CG) 46 is formed via a insulation film 45. The contact C to the word line penetrates the control gate 46 to reach this floating gate 444 Accordingly, in the dummy memory cell 186A, the floating gate 44 and the control gate 46 are electrically short-circuited by the contact C. For comparison, FIG. 14 shows the cross-sectional structure of a memory cell in the memory cell array 1 and a redundant memory cell in the redundant memory dell array 1a.

Namely, different from the normal memory cell or the redundant memory cell, the dummy memory cell 186A in this embodiment has a structure similar to that of a normal MOS transistor, and has a threshold voltage determined on the basis of a channel impurity concentration and a gate oxide thickness. Therefore, the voltage adjuster circuit 184 supplies the row decoder 185 with a voltage that reflects a difference from the threshold voltage of the "1" data memory cell in the redundant memory cell array 1a.

In the case of the structure of the third embodiment, the threshold voltage of the dummy memory cell 186A is not determined from the number of electron strapped in the floating gate. Rather, it can be determined on the basis of the channel impurity concentration and the gate oxide thickness as described above, like the normal transistor. If the dummy memory cell 186 is composed of a stacked-gate structure transistor, its threshold voltage may fluctuate. In order to reduce the possibility of the fluctuation, a high voltage always applied to the gate should be avoided.

In the present embodiment, however, the dummy memory cell 186 substantially has no stacked-gate structure. Accordingly, even if it is configured such that a high voltage is always applied to the gate to always monitor the state of the boosted voltage VDDR, there is no possibility of fluctuations of the threshold voltage. Therefore, the present embodiment makes it possible to always monitor the state of the boosted voltage VDDR and execute a more accurate redundancy replacement control.

Fourth Embodiment

Figure 15:
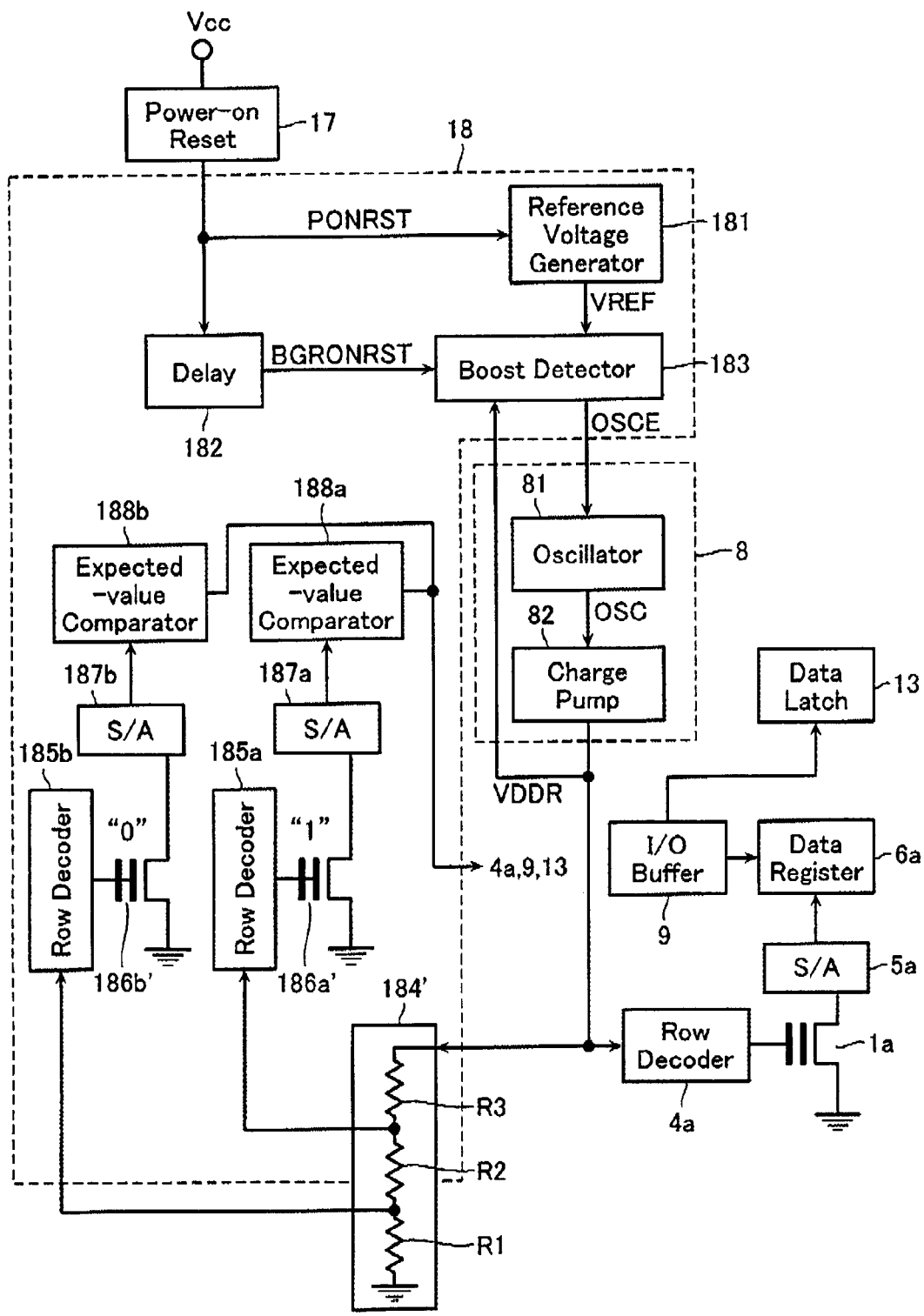
FIG. 15 is a block diagram showing an arrangement of a non-volatile semiconductor memory device according to a fourth embodiment of the present invention.

FIG. 15 is a block diagram showing an arrangement of the defect address read permission circuit 18 in a non-volatile semiconductor memory device according to a fourth embodiment of the present invention. The arrangement of the entire of the non-volatile semiconductor memory device is similar to that in the first embodiment and the same components in FIG. 13 as those in the first embodiment (FIG. 3) are denoted with the same reference numerals.

This embodiment comprises two types of row decoders 185, dummy memory cells 186, sense amps 187 and expected value comparators 188, like the second embodiment. The dummy memory cells 186a, 186b are given "1", "0" as expected data, respectively. The dummy memory cells 186a, 186b have a stacked structure, in which a word line extends through a control gate and contacts a floating gate, like the third embodiment. Therefore, also in this embodiment, without the possibility of fluctuations of the threshold voltage of the dummy memory cells 186a, 186b, it can be configured such that a word line voltage is always applied to the gates of the dummy memory cells 186a, 186b continuously in order to always monitor the boosted voltage VDDR. A voltage adjuster circuit 184' may be configured of a divider resistor circuit as shown in FIG. 15 to apply respective different threshold voltages to the row decoders 185a, 185b.

The embodiments of the invention are described above though the present invention is not limited to these embodiments but rather can be given various modifications, replacements, deletions and additions without departing from the scope and spirit of the invention. For example, the example described in the above embodiments is related to the case where the external supply voltage is boosted at the high-voltage generator circuit 8 and supplied to the row decoder and so forth. If the external supply voltage is sufficiently higher, however, the high-voltage generator circuit may be omitted and the present invention is also applicable to such the non-volatile semiconductor memory device. In addition, various circuits described with reference to the drawings are not limited to those shown in the figures but can be replaced by various circuits having the similar functions and actions.

What is claimed is:

1. A non-volatile semiconductor memory device, comprising:

a memory cell array including electrically rewritable non-volatile memory cells arrayed;

a redundant memory cell having threshold voltages differing in accordance with data to be stored and storing address data of a defect cell in said memory cell array;

a first decoder circuit given a first drive voltage to provide a control signal to said redundant memory cell;

a latch circuit storing said address data of said defect cell read out of said redundant memory cell;

a dummy memory cell having a threshold voltage corresponding to said redundant memory cell;

a second decoder circuit given a second drive voltage corresponding to said first drive voltage to provide a control signal to said dummy memory cell;

a comparator circuit operative to compare data to be read out of said dummy memory cell with data actually read out of said dummy memory cell and, based on a result of the comparison, permit said redundancy replacement control to be started a power-on reset circuit providing a power-on reset signal when the power-on reset circuit detects that said external supply voltage rises and reaches a certain value;

a reference voltage generator circuit generating a certain reference voltage from said external supply voltage;

a delay circuit providing a delayed signal at a certain delayed timing after receipt of said power-on reset signal;

a booster circuit that starts boosting said external supply voltage on receipt of said delayed signal to generate a boosted voltage; and a boost detector circuit comparing said boosted voltage with said reference voltage and, based on a result of the comparison, halting operation of said booster circuit, wherein said first row decoder is driven by said boosted voltage as said first drive voltage.

2. The non-volatile semiconductor memory device according to claim 1, further comprising a booster circuit boosting an external supply voltage to provide a boosted voltage, wherein said first row decoder is driven by said boosted voltage as said first drive voltage.

3. The non-volatile semiconductor memory device according to claim 1, wherein said reference voltage generator circuit starts operation on receipt of input of said power-on reset signal.

4. The non-volatile semiconductor memory device according to claim 1, further comprising a voltage adjuster circuit adjusting said first drive voltage to generate a second drive voltage.

5. The non-volatile semiconductor memory device according to claim 1, wherein said dummy memory cell has the same threshold voltage as the threshold voltage of said redundant memory cell.

6. The non-volatile semiconductor memory device according to claim 1, wherein said memory cell and said redundant memory cell has a stacked-gate structure in which a floating gate and a control gate are stacked with a insulation film therebetween, and said dummy memory cell has a structure in which said floating gate and said control gate are electrically short-circuited.

7. The non-volatile semiconductor memory device according to claim 1, wherein said dummy memory cell includes a first dummy memory cell having a first threshold voltage, and a second dummy memory cell having a second threshold voltage lower than said first threshold voltage, wherein said comparator circuit compares data to be read out of said first dummy memory cell with data actually read out, compares data to be read out of said second dummy memory cell with data actually read out and, based on results of the comparisons, permits said redundancy replacement control to be started.

8. The non-volatile semiconductor memory device according to claim 7, further comprising:

a power-on reset circuit providing a power-on reset signal when it detects that said external supply voltage rises and reaches a certain value;

a reference voltage generator circuit generating a certain reference voltage from said external supply voltage;

a delay circuit providing a delayed signal at a certain delayed timing after receipt of said power-on reset signal;

a booster circuit that starts boosting said external supply voltage on receipt of said delayed signal to generate a boosted voltage; and a boost detector circuit comparing said boosted voltage with said reference voltage and, based on a result of the comparison, halt operation of said booster circuit, wherein said first row decoder is driven by said boosted voltage as said first drive voltage.

9. The non-volatile semiconductor memory device according to claim 8, wherein said reference voltage generator circuit starts operation on receipt of input of said power-on reset signal.

10. The non-volatile semiconductor memory device according to claim 7, further comprising a voltage adjuster circuit operative to adjust said first drive voltage to generate a second drive voltage.

11. The non-volatile semiconductor memory device according to claim 7, wherein said dummy memory cell has the same threshold voltage as the threshold voltage of said redundant memory cell.

12. The non-volatile semiconductor memory device according to claim 7, wherein said memory cell and said redundant memory cell has a stacked-gate structure in which a floating gate and a control gate are stacked with a insulation film therebetween, and said dummy memory cell has a structure in which said floating gate and said control gate are electrically short-circuited.

* * * * *